(12) United States Patent
Sawdai et al.

(10) Patent No.: US 6,924,203 B2
(45) Date of Patent: Aug. 2, 2005

(54) DOUBLE HBT BASE METAL MICRO-BRIDGE

(75) Inventors: Donald James Sawdai, Redondo Beach, CA (US); Gregory Scott Leslie, Irvine, CA (US); Augusto Gutierrez-Aitken, Redondo Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/445,612

(22) Filed: May 27, 2003

(65) Prior Publication Data

US 2004/0238843 A1 Dec. 2, 2004

(51) Int. Cl.$^7$ .............................................. H01L 21/332
(52) U.S. Cl. ...................... 438/319; 438/312; 438/318; 438/343; 438/349; 438/738; 438/739
(58) Field of Search ................................ 438/312, 318, 438/319, 343, 349, 738, 739

(56) References Cited

U.S. PATENT DOCUMENTS

| | | | |
|---|---|---|---|
| 5,620,907 A | | 4/1997 | Jalali-Farahani et al. |
| 5,700,701 A | * | 12/1997 | Hill et al. ...................... 437/31 |
| 5,736,417 A | | 4/1998 | Oki et al. |
| 5,739,062 A | | 4/1998 | Yoshida et al. |
| 5,943,577 A | * | 8/1999 | Contrata et al. ............. 438/319 |
| 5,946,582 A | | 8/1999 | Bhat |
| 6,285,044 B1 | | 9/2001 | Bhat |
| 6,376,867 B1 | | 4/2002 | Gutierrez-Aitken et al. |
| 6,495,869 B2 | | 12/2002 | Blayac et al. |
| 2001/0023947 A1 | | 9/2001 | Gutierrez-Aitken et al. |
| 2002/0060327 A1 | | 5/2002 | Chen et al. |

FOREIGN PATENT DOCUMENTS

WO    WO 03/063228 A1    7/2003

OTHER PUBLICATIONS

European Search Report for EP 03 25 6974, Completed Sep. 16, 2004; Examiner K. Berthold.

G–Jarrix et al.: "*Analysis of 1/f Noise Current Sources in InP/InGaAs Heterojunction Bipolar Transistors*" Journal of Applied Physics, American Institute of Physics. New York, US, vol. 93, No. 7, Apr. 1, 2003, pp. 4246–4252, XP012059377 ISSN: 0021–8979 *figures 1, 2*.

(Continued)

*Primary Examiner*—Tom Thomas
*Assistant Examiner*—N. Drew Richards
(74) *Attorney, Agent, or Firm*—Tarolli, Sundheim, Covell & Tummino L.L.P.

(57) ABSTRACT

A heterojunction bipolar transistor (HBT) device structure is provided which facilitates the reduction of the base-collector capacitance and a method for making the same. The base-collector capacitance is decreased by fabricating a base micro-bridge connecting a base contact to a base mesa on the HBT. The base micro-bridge is oriented along about one of 001, 010, 00$\bar{1}$, and 0$\bar{1}$0 direction to a major flat of the wafer. The HBT device employs a phosphorous based collector material. During removal of the phosphorous based collector material, the base layer is undercut forming the micro-bridge, successfully removing the collector and sub-collector material below the bridge due to the orientation of the micro-bridge. The removal of collector and sub-collector material reduces the base-collector junction area, and therefore reduce the base-collector junction capacitance.

9 Claims, 11 Drawing Sheets

OTHER PUBLICATIONS

Ida M et al.: "*High–Performance Small INP/INGAAS HBTS with Reduced Parasitic Base–Collector Capacitance Fabricated Using a Novel Base–Metal Design*" Compound Semiconductors 1999. Proceedings of the 26th International Symposium on Compound Semiconductors. Berlin, Aug. 22–26, 1999, Institute of Physics Conference Series, London: IOP, GB, vol. NR. 166, Aug. 22, 1999, pp. 293–296, CP000921520 ISBN: 0–7503–0704–8 *p. 294; figure 2*.

Blayac S et al: "*Lateral Design of InP/InGaAs DHBTs for 40 GBIT/s Ics*" Conference proceedings. 2000 International Conference on Indium Phosphide and Related materials (Cat. No. 00CH37107) IEEE Piscataway, NJ, USA, 2000, pp. 481–484, XP002295699 ISBN: 0–7803–6320–5 *p. 482; figure 2*.

M. W. Dvorak, et al., "Design and Performance of InP/GaAsSb/InP Double Heterojunction Bipolar Transistors". J. Vac. Sci. Technol. A 18(2), pp. 761–764, Mar./Apr. 2000.

Y. Miyamoto, et al., "Reduction of Base–Collector Capacitance by Undercutting the Collector and Subcollector in GaInAs/InP DHBT's", IEEE Electron Device Letters, vol. 17, No. 3, pp. 97–99, Mar. 1996.

Yongjoo Song, et a., "Reduction of Extrinsic Basec–Collector Capacitance in InP/InGaAs SHBT's Using a New Base Pad Design", Indium Phosphide and Related Materials Conference, 2002, IPRM, 14th, 2002, pp. 165–168.

A. Gutierrez–Aitken, et al, "InP HBT Production Process", Copyright 2002, GaAs MANTECH, Inc.

* cited by examiner

DOUBLE HBT BASE METAL MICRO-BRIDGE

TECHNICAL FIELD

The present invention relates generally to electrical circuits, and more particularly to fabrication of heterojunction bipolar transistors.

BACKGROUND OF THE INVENTION

Heterojunction bipolar transistors (HBTs) are widely used in high speed and high frequency applications. The heterojunction bipolar transistor (HBT) offers much higher speeds of operation than the more prevalent metal-oxide-semiconductor field-effect transistors (MOSFETS) or even conventional homojunction bipolar transistors, such as npn or pnp silicon transistors. The HBT offers an alternative technology to metal semiconductor field effect transistors (MESFETs) and high electron mobility transistors (HEMTs) when a high degree of linearity is desirable. The use of different materials of differing bandgaps for the collector, base and emitter provides for * additional design flexibility. The HBT is a layered structure that includes a semiconductor substrate, a subcollector, a collector, a base and an emitter stacked one on top the other in an integral assembly. Metal contacts are formed to connect power and other circuitry to the emitter, the base and the subcollector. The largest limitation to the operational frequency and speed of the HBT is the base-collector capacitance. The base-collector capacitance is largely due to the collector-base interface area. Reduction of the base area can introduce higher base resistance due to the reduction of the area of the base contact.

A common HBT technology is based on Gallium Arsenide (GaAs)/Gallium Aluminum Arsenide (GaAlAs) based family. The GaAs based HBT suffers from base-collector capacitance due to the area of the interface between the base and collector layers. One method of reducing the base collector capacitance of a GaAs based HBT is to implant protons into an area of the collector surrounding the emitter so as to electrically insulate the implanted area. Another HBT technology is based on the Indium Phosphide (InP)/Indium Gallium Arsenide (InGaAs) material family. The InP/InGaAs HBT also suffers from base-collector capacitance. However, proton implantation has proved ineffective in rendering InP to be sufficiently insulating or semi-insulating.

Miyamoto et al. addresses this problem by performing a selective etchant to substantially etch the collector layer under the base layer so as to undercut the edges of the base layer of InP-based HBTs in "Reduction of Base-Collector Capacitance by Undercutting the Collector and Subcollector in GaInAsInP DHBT's," IEEE Electron Device Letters, vol. 17, March 1996, pp. 97–99. The undercuts are then back-filled with polyimide to provide mechanical integrity. The reduced size of the collector, together with the lower dielectric constant of the polyimide, reduces the base-collector capacitance. However, this approach does not reduce the base-collector capacitance component from under the base contact. Other methods to reduce base-collector capacitance include using an electrically insulating region of iron (Fe) doped InP replacing part of the collector to reduce the base-collector area.

Another method of reducing the base-collector capacitance has been to reduce the base area and form a base metal micro-bridge to a base contact disposed away from the active portion of the HBT. The base metal micro-bridge is typically formed by depositing the base metal and then etching away the semiconductor from underneath a portion of the base metal. Song et al. demonstrate this technique for an HBT with an InGaAs collector layer in "Reduction of Extrinsic Base-Collector Capacitance in InP/InGaAs SHBTs Using a New Base Pad Design, INP and Related Materials Conference, 2002, pp. 165–168." However, it is difficult to fabricate the base metal micro-bridge for HBTs that have phosphorus based collector layers and arsenic based base layers due to the unusual etching characteristics of phosphorous based materials. A similar technique is demonstrated for removing InP subcollector layers (but not the collector layer) using a cumbersome double base contact pad by Ida et al. in "InP/InGaAs DHBTs with 341-GHz for a big current density over 800 kA/cm$^2$, IEEE Electron Device Meeting, 2001, pp. 35.4.1–35.4.4."

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates to a HBT device structure which facilitates mitigation of base-collector capacitance and a method for making the same. The HBT device structure of the present invention employs a phosphorous based collector material. During removal of the phosphorous based collector material, for example, using a wet etch, only facets or geometric surfaces that are part of a convex side of the HBT, and are oriented at about a +/−45° (010 or 001 direction) or about a +/−135° (00$\bar{1}$ or 0$\bar{1}$0 direction) from the major flat of the wafer will be undercut (major flat is in the 00$\bar{1}$ crystal plane). The base-collector capacitance is decreased by reducing the base mesa area and fabricating a base connecting bridge or micro-bridge that electrically connects a base contact to the base mesa. The base connecting bridge is positioned along a 45° angle to a major flat of the wafer. During collector removal, the base layer is undercut forming the connecting bridge, successfully removing the collector and sub-collector material below the bridge. The removal of collector and sub-collector material will reduce the base-collector junction area, and therefore reduce the base-collector junction capacitance.

Additionally, a base undercut cantilever base contact structure further reduces the base-collector capacitance. The base undercut cantilever base contact structure is provided by aligning the orientation of the intrinsic HBT portion and base contact portions along a 45° angle to the major flat. Therefore, undercutting portions of the collector and subcollector that have a convex geometric surface under the base mesas during the etching process a cantilever base contact structure.

To the accomplishment of the foregoing and related, ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

The present invention relates to a HBT device structure which facilitates mitigation of base-collector capacitance and a method for making the same. The HBT device of the present invention exhibits faster performance at higher frequencies than many conventional HBT devices. The HBT device of the present invention employs a phosphorous (e.g., Indium Phosphide (InP), Indium Gallium Phosphide (InGaP)) based collector material. During removal of the phosphorous based collector material, for example, by using a wet etch, only facets that are part of a convex side of the HBT, and are oriented about a +/−45° (010 or 001 direction) or about a +/−135° (00$\bar{1}$ or 0$\bar{1}$0 direction) from the major flat of the wafer will be undercut (major flat is in the 00$\bar{1}$ crystal plane). The base-collector capacitance is decreased by fabricating a base micro-bridge on an InP-based HBT or double HBT (DHBT) by positioning the base micro-bridge along about a +/−45° or about a +/−135° angle to a major flat of the wafer. The HBT has one material for the emitter with another material for the collector, while the DHBT has three different materials for the emitter, base and collector. During collector removal, the collector layer is undercut forming the micro-bridge, successively removing the collector and sub-collector material below the bridge. The removal of collector and sub-collector material will reduce the base-collector junction area, and therefore reduce the base-collector junction capacitance. Additionally, a base undercut cantilever base contact structure further reduces the base-collector capacitance.

Figure 1:
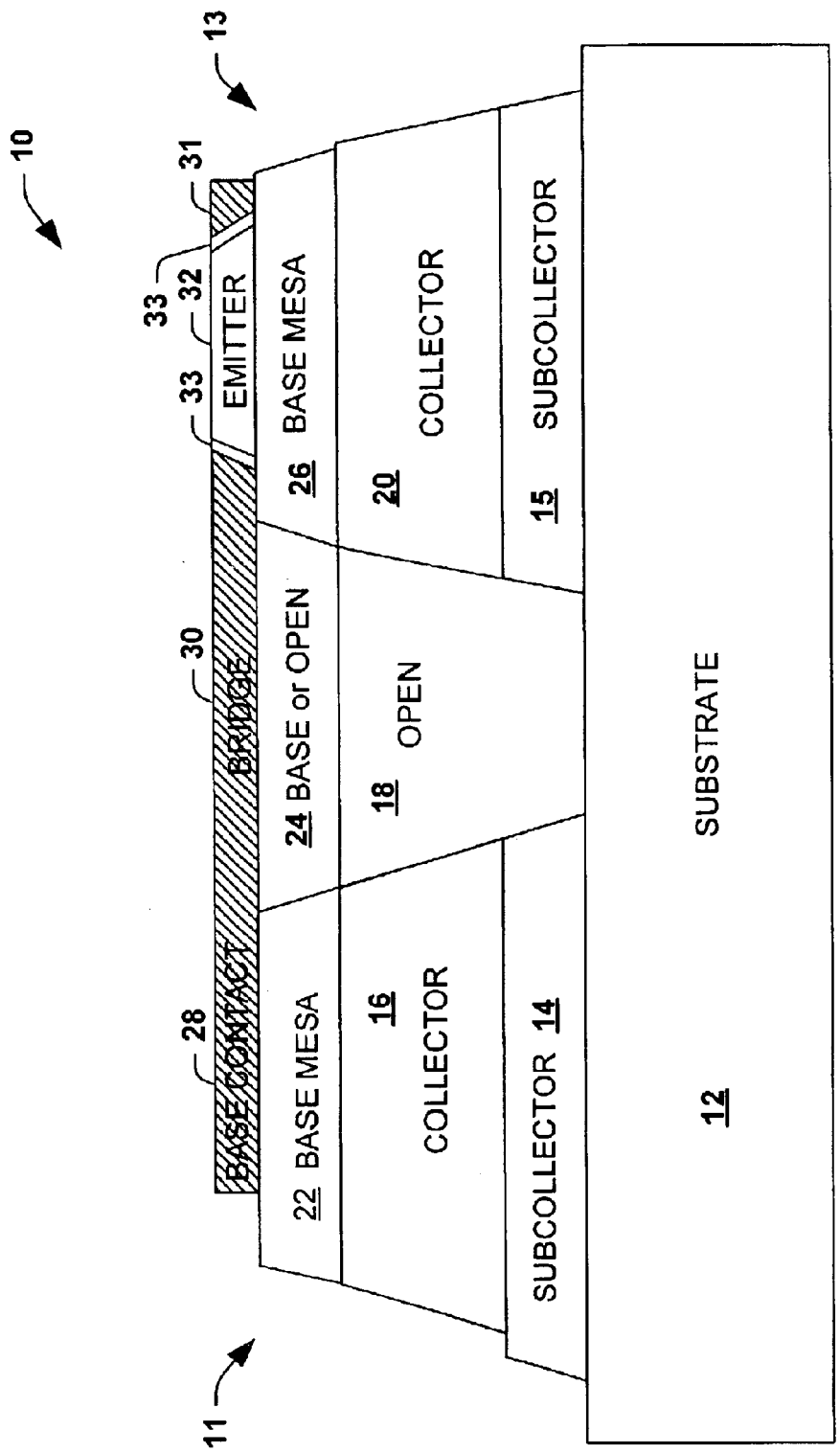
FIG. 1 illustrates a schematic cross-sectional view of a HBT device structure in accordance with an aspect of the present invention.

FIG. 1 illustrates a schematic cross-sectional illustration of a HBT device structure 10 (e.g., double HBT device) in accordance with the present invention. The device structure 10 includes an InP substrate wafer 12. The InP substrate 12 provides mechanical support for the device structure 10, and is of a thickness suitable for providing such support. The device structure 10 includes a base contact portion 11 and an intrinsic HBT portion 13. The base contact portion 11 includes a first subcollector region 14, a first collector region 16 residing over the first subcollector region 14, a first base mesa 22 residing over the first collector region 16 and a base contact 28 residing over the first base mesa 22. The first subcollector region 14, the first collector region 16 and the first base mesa 22 are provided for mechanical support of the base contact 28 and are not provided to form electrically active components of the HBT device structure 10. The intrinsic HBT portion 13 includes a second subcollector region 15 residing over the InP substrate 12, a second collector region 20 residing over the second subcollector region 15, a second base mesa 26 residing over the second collector region 20 and an emitter 32 residing over the second base mesa 26. The second subcollector region 15, the second collector region 20, the second base mesa 26, and the emitter 32 form the electrically active components of the total HBT device structure 10.

The base material that forms the first and second base mesas 22 and 26 is comprised of an arsenic based material (e.g., Indium Gallium Arsenide (InGaAs), Indium Aluminum Arsenide (InAlAs), Indium Aluminum Gallium Arsenide (InAlGaAs), Gallium Arsenide Antimonide (GaAsSb), Gallium Arsenide (GaAs)). The collector material that forms the collector regions 16 and 20 and the subcollector regions are comprised of a phosphorous based material (e.g., Indium Phosphide (InP), Indium Gallium Phosphide (InGaP)). While arsenic based materials undercut easily during a selective etching process, the phosphorous based materials do not readily undercut many geometric structures or facets. The present invention provides a mechanism to undercut a phosphorous layer by orienting a conductive bridge 30 (e.g., metal bridge) that connects the second base mesa 26 to a base contact 28 along about a +/−45° or about a +/−135° angle to the major flat of the substrate 12. The conductive bridge 30 can be formed from a variety of conductive materials (e.g., metal).

An open area 18 resides below a conductive bridge 30 and a remaining base material portion 24. Alternatively, the remaining base material portion 24 can be removed during fabrication. The conductive bridge 30 forms an electrical connection from the base mesa 26 to the base contact 28. Therefore, the base mesa area 26 can be reduced in area mitigating the effects of the base-collector capacitance of the HBT device structure 10. The conductive bridge 30 is oriented at about a +/−45° or about a +/−135° angle from the major flat of the substrate 12. Therefore, during the etching of the collector and the subcollector material, the portion of the collector and the subcollector underneath the base material portion 24 and the conductive bridge 30 is undercut on any convex geometric side or facet of the HBT device structure 10.

Figure 2:
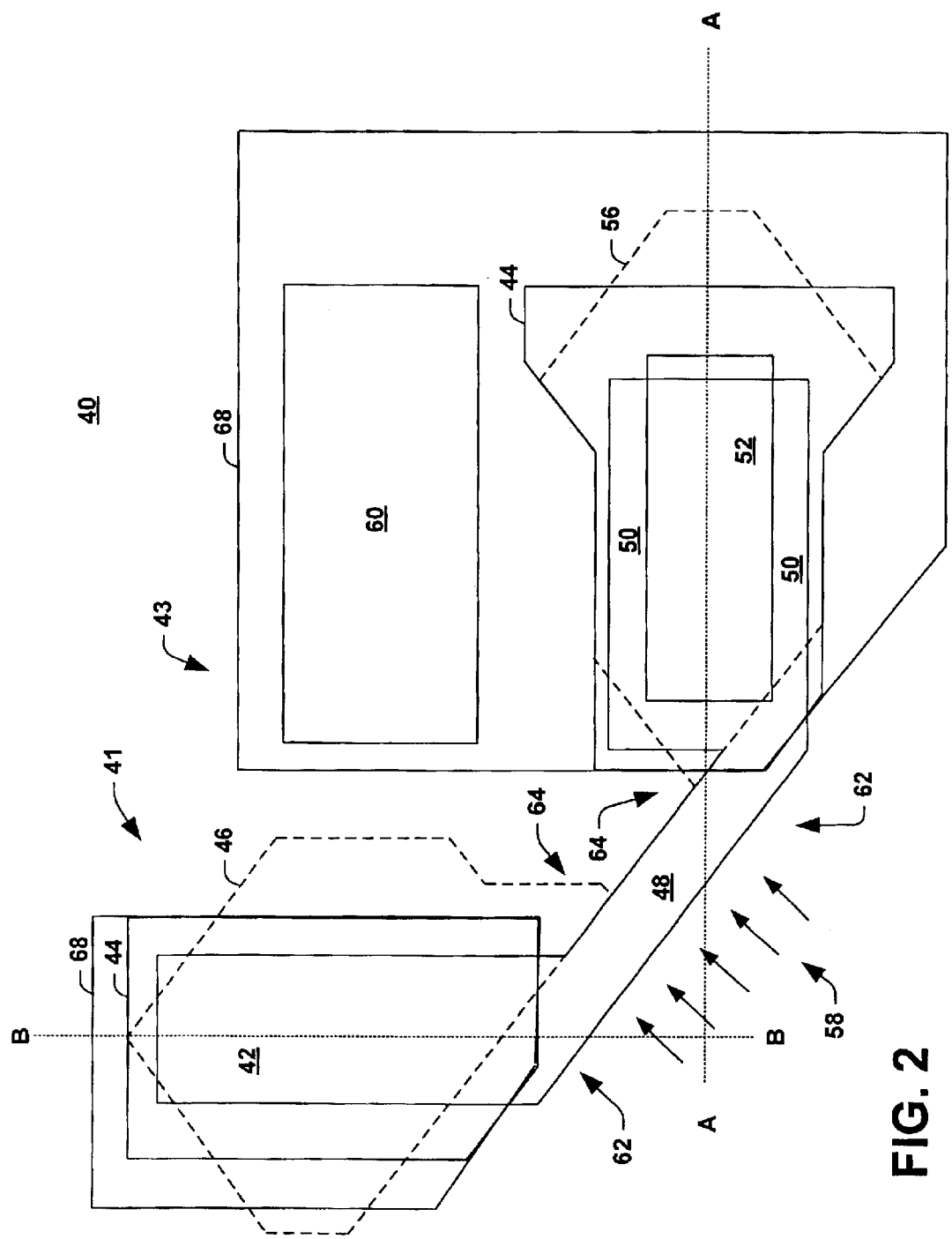
FIG. 2 illustrates a top representative view of a layout of a HBT device structure having a 45° angle bridge orientation in accordance with an aspect of the present invention.

FIG. 2 illustrates a top representative view of a layout of a HBT 40 having a 45° angle bridge orientation in accordance with an aspect of the present invention. The HBT 40 includes a base contact portion 41 having a first longitudinal axis B—B and an intrinsic HBT portion 43 having a second longitudinal axis A—A substantially normal to the first longitudinal axis. The base contact portion 41 and the intrinsic HBT portion 43 are coupled to one another by a conductive bridge 48 oriented at about a +/−45° or about a +/−135° angle with respect to the major flat of the wafer. The base contact portion 41 includes a base contact 42 and a first base/collector mesa 46 illustrated in dashed lines. The intrinsic HBT portion 43 includes an emitter 52 and a second base/collector mesa 56 illustrated in dashed lines. A photoresist or nitride hardmask 44 is employed during formation of the first and second base/collector mesas 46 and 56. A conductive contact portion 50 couples a base mesa portion of the second base/collector mesa 56 to the base contact 42 via the conductive bridge 48. A collector contact 60 is coupled to a subcollector region 68 of the HBT 40.

During a collector etch process (e.g., selective collector wet etch), the collector material is removed and undercuts underneath the base material below the bridge in the direction of the arrows 58. Since the collector material is formed from a phosphorous based material, the collector etch process only undercuts facets that are oriented at about a +/−45° or about a +/−135° to a major flat of the wafer. This is referred to as the [010] family of planes. Additionally, the collector etch only undercuts planes that are convex (i.e., greater or equal to 180°) not concave planes (i.e., less than 180°). Therefore, the collector etch will undercut the convex planes 62 in the direction of arrows 58, but not the concave planes 64. The subcollector material is also formed from a phosphorous based material. A sub-collector etch is then performed to form the subcollector region 68, and remove the subcollector material from underneath the conductive bridge 48.

Figure 3:
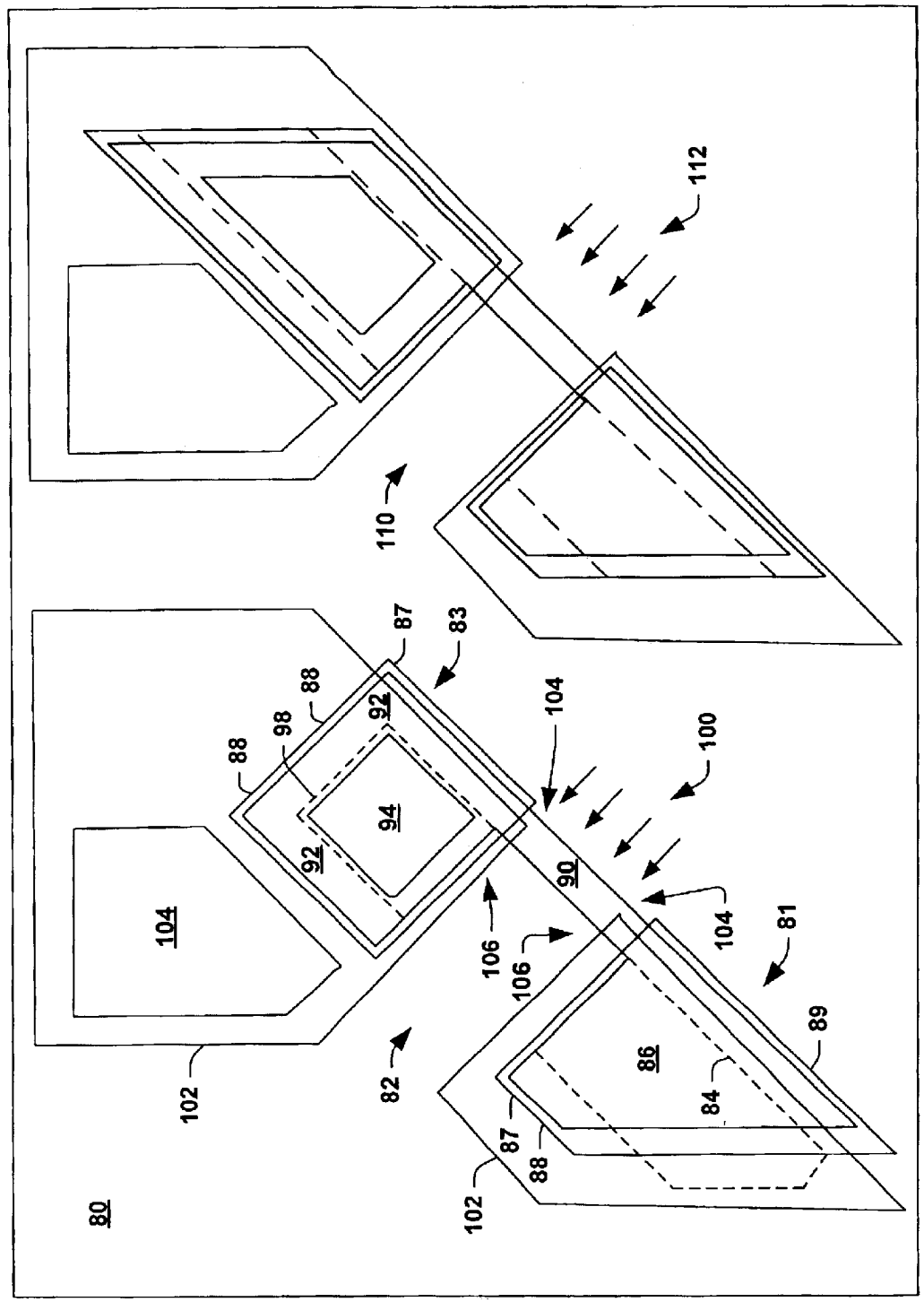
FIG. 3 illustrates a top representative view of a layout of a plurality of HBT device structures on an integrated circuit in accordance with an aspect of the present invention.
Figure 4:
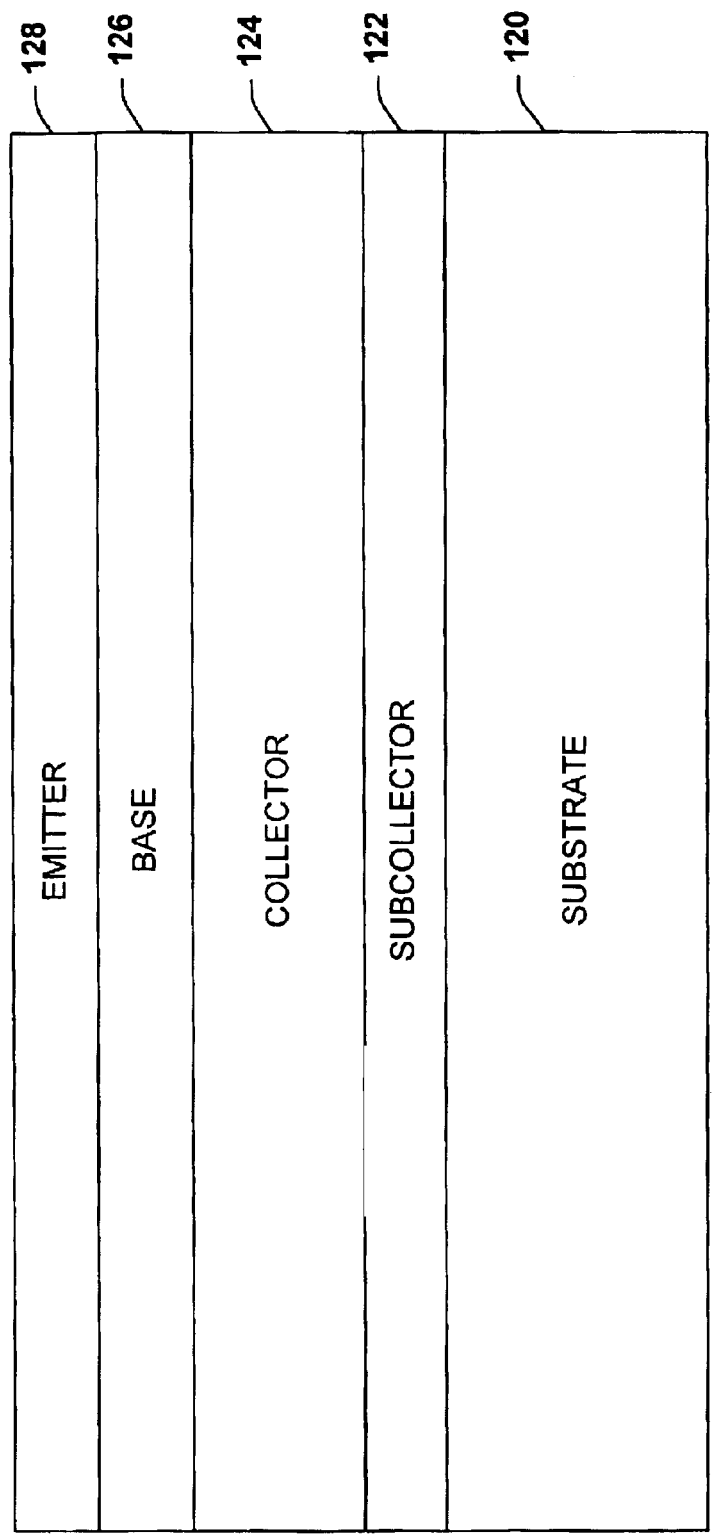
FIG. 4 is a schematic cross-sectional illustration of a plurality of stacked layers for forming a HBT device structure in accordance with an aspect of the present invention.
Figure 5:
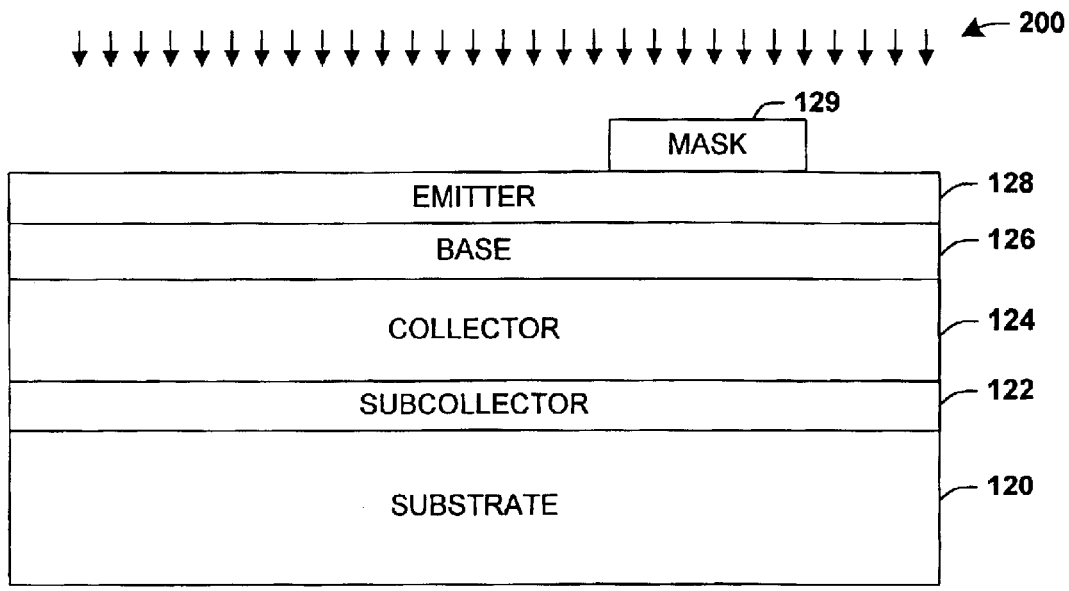
FIG. 5 is a schematic cross-sectional illustration of the structure of FIG. 4 undergoing an etch to form an emitter in accordance with an aspect of the present invention.

FIG. 3 illustrates a top representative view of a layout of a plurality of HBTs on an integrated circuit 80 disposed on a wafer with each HBT having about a +/−45° or about a +/−135° angle bridge orientation in accordance with another aspect of the present invention. The HBTs have a base undercut cantilever base contact structure that further reduces the base-collector capacitance. The base undercut cantilever base contact structure is provided due to alignment of the orientation of the intrinsic HBT portions and base contact portions along about a +/−45° or about +/−135° angle to a major flat. Therefore, portions of the collector and subcollector that have a convex geometric surface under the base mesas will undercut during the etching process. Additionally, aligning the intrinsic HBT portions and base contact portions in this manner facilitates improved density packing of the HBT devices on the integrated circuit 80. In the illustration of FIG. 3, a first HBT device 82 resides next to a second HBT device 110. The second HBT device 110 illustrates an alternate geometry from the first HBT device 82. However, the components of the first HBT device 82 and the second HBT device 110 are identical, therefore, a general discussion of the second HBT device 110 will be omitted.

The first HBT device 82 includes a base contact portion 81 and an intrinsic HBT portion 83 aligned along about a +/−45° or about a +/−135° angle with respect to a major flat of the wafer. The base contact portion 81 and the intrinsic HBT portion 83 are coupled to one another by a conductive bridge 90 oriented at about a +/−45° or about +/−135° angle with respect to the major flat of the wafer, and aligned with the base contact portion 81 and the intrinsic HBT portion 83. The base contact portion 81 includes a base contact 86 and a first collector mesa 84 illustrated in dashed lines. The intrinsic HBT portion 83 includes an emitter 94 and a second collector mesa 98 illustrated in dashed lines. A photoresist or dielectric hardmask 88 is employed during formation of the first and second collector mesas 84 and 98. A first base mesa 87 and a second mesa 89 reside underneath the dielectric hardmask 88. A conductive contact portion 92 couples the second base mesa 89 to the base contact 86 via the conductive bridge 90. A collector contact 104 is coupled to a subcollector region 102 of the HBT 82.

During a collector etch process (e.g., selective collector wet etch), the collector material is removed and undercuts the base material below the bridge in the direction of the arrows 100. Since the collector material is formed from a phosphorous based material, the collector etch process only undercuts facets that are oriented at about a +/−45° or about a +/−135° to a major flat of the wafer. Additionally, the collector etch only undercuts planes that are convex (i.e., greater or equal to 180°) not concave planes (i.e., less than 180°). Therefore, the collector etch will undercut the convex planes 104 in the direction of the arrows 100, but not the concave planes 106. During the collector etch process, the collector material will also be removed from underneath the bridge of the second HBT 110 in the direction of the arrows 112. It is to be appreciated that any number of HBTs can be fabricated concurrently, only limited by the size of the HBTs, the integrated circuits and the wafer on which the integrated circuits reside.

Turning now to FIGS. 4–18, process blocks in connection with fabrication of the HBT device in accordance with an aspect of the present invention are described. A substrate 120 (e.g., InP substrate, GaAs substrate) or wafer is provided with several stacked layers disposed above the substrate 120. A subcollector layer 122 resides over the substrate 120, a collector layer 124 overlays the subcollector layer 122, a base layer 126 overlays the collector layer 124 and an emitter layer 128 overlays the base layer 126. The subcollector layer 122, the collector layer 124, the base layer 126 and the emitter layer 128 can be formed by epitaxial growth of each layer. It is to be appreciated that any suitable technique for forming the various layers can be employed such as Molecular Beam Epitaxy (MBE), Metal Organic Chemical Vapor Deposition (MOCVD) and Chemical Beam Epitaxy (CBE). It is to be appreciated that other layers can be added such as emitter caps, etch stops and grading layers without appreciably modifying the fabrication of the HBT device.

The base layer 126 is formed from an arsenic based material (e.g., InGaAs, InAlAs, InAlGaAs, GaAsSb, GaAs). The collector layer 124 and the subcollector layer 122 are formed from a phosphorous based material (e.g., InP, InGaP). Alternatively, the subcollector can be formed from an arsenic based material. As previously discussed, arsenic based materials undercut easily during a selective etching process, while the phoshphorous based materials do not readily undercut many geometric structures. Therefore, to perform and undercut operation to remove the collector material and subcollector material beneath a conductive bridge connecting a base contact portion with an intrinsic HBT portion, the conductive bridge will be oriented along a 45° angle to a major flat of the substrate 120.

Figure 6:
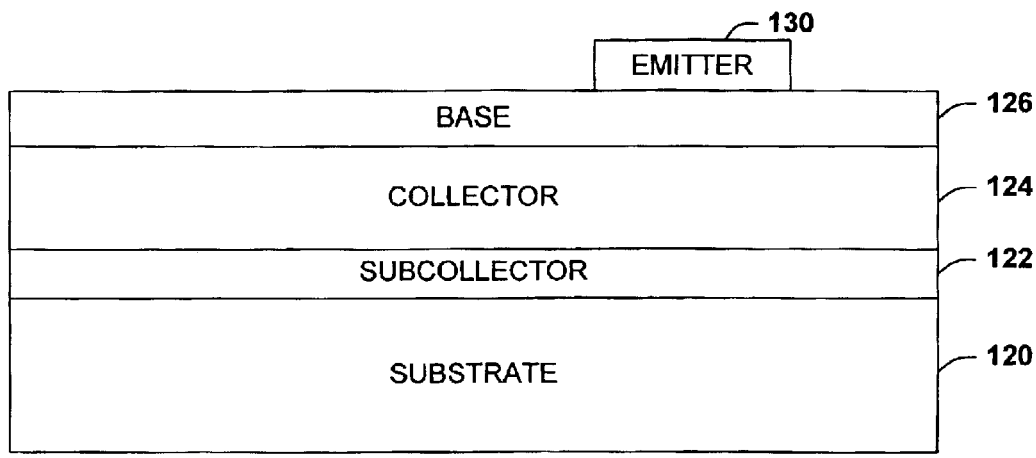
FIG. 6 is a schematic cross-sectional illustration of the structure of FIG. 5 after the etch to form the emitter is substantially complete in accordance with an aspect of the present invention.

An etch 200 (e.g., anisotropic reactive ion etching (RIE), wet etch) (FIG. 5) is performed to remove the emitter material layer 128 employing a photoresist or metal mask 129 to form an emitter 130 (FIG. 6). Any suitable etch technique may be used to etch the emitter material layer 128. For example, the emitter material layer 128 can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor by a wet etch or a by a combination of these techniques to form the emitter 130.

Figure 7:
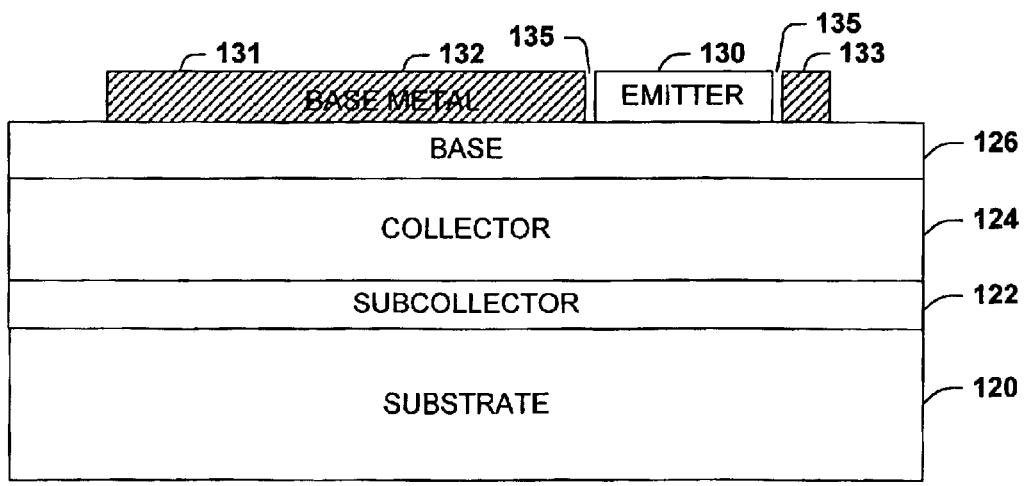
FIG. 7 is a schematic cross-sectional illustration of the structure of FIG. 6 after undergoing a deposition process to form a base contact, a connecting bridge and a contact to a base mesa on the emitter portion of the HBT device structure in accordance with an aspect of the present invention.

Next, a deposition is performed on the structure of FIG. 6. The deposition includes depositing a base metal (e.g., aluminum, titanium, gold, tungsten, platinum) to provide a connection between the base mesa on the intrinsic HBT portion and the base contact on the base contact portion. The metal layer forms a base contact 131, a connecting bridge 132 between the intrinsic HBT portion and a contact 133 on the base mesa on the intrinsic HBT portion. Gaps 135 separate the emitter 130 from the contact 133. It is to be appreciated that a plurality of conductive materials can be employed to provide the functionality associated with the base metal. The resultant structure is illustrated in FIG. 7.

Figure 8:
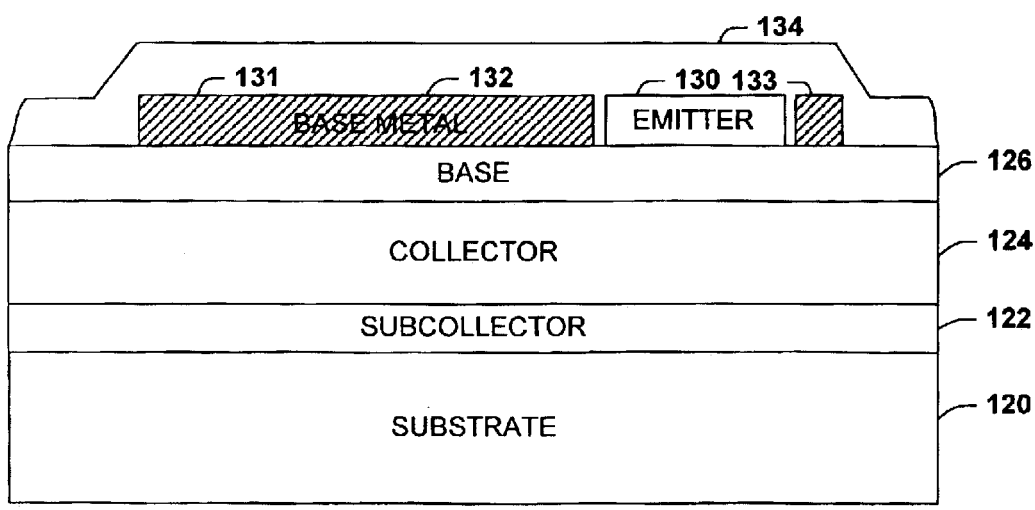
FIG. 8 is a schematic cross-sectional illustration of the structure of FIG. 7 after a photoresist layer has been formed on the structure in accordance with an aspect of the present invention.
Figure 9:
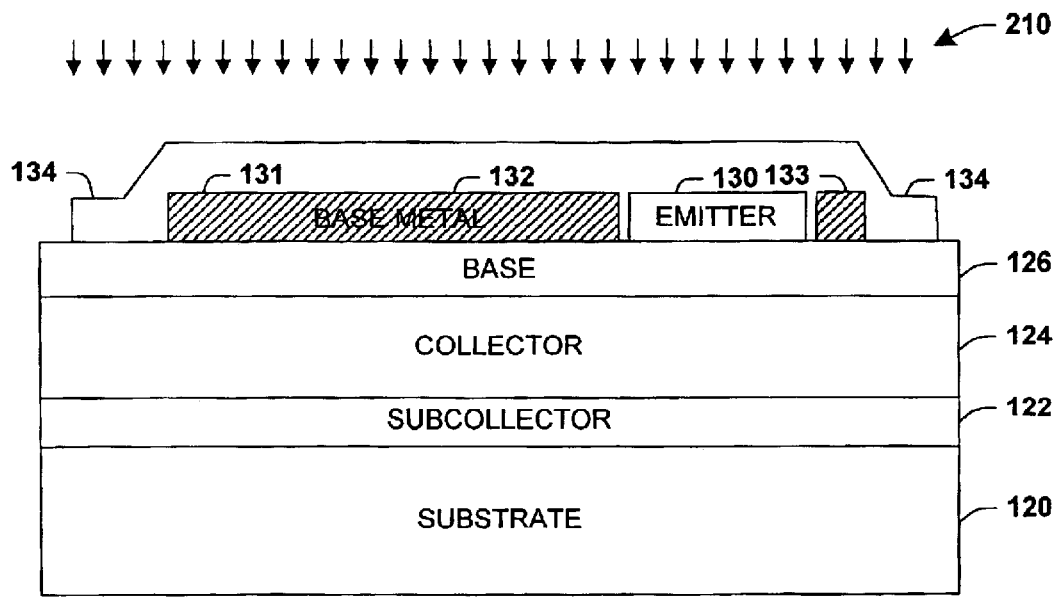
FIG. 9 is a schematic cross-sectional illustration of the structure of FIG. 8 undergoing patterning of the photoresist layer in accordance with an aspect of the present invention.
Figure 10:
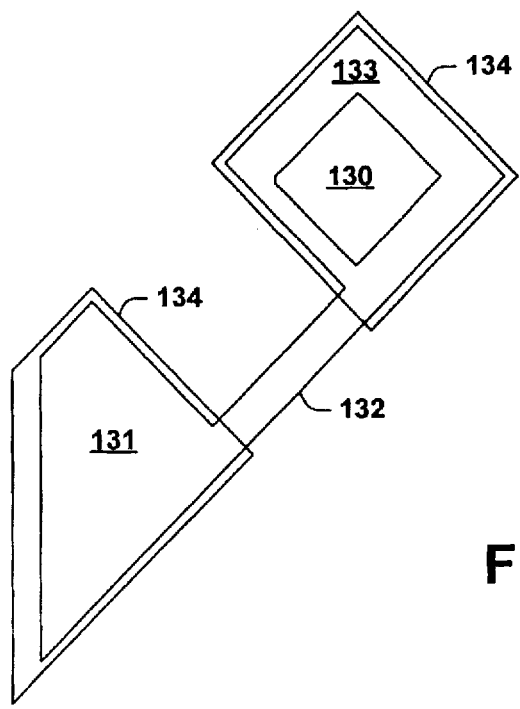
FIG. 10 illustrates a top representative view of the structure of FIG. 9 in accordance with an aspect of the present invention.
Figure 11:
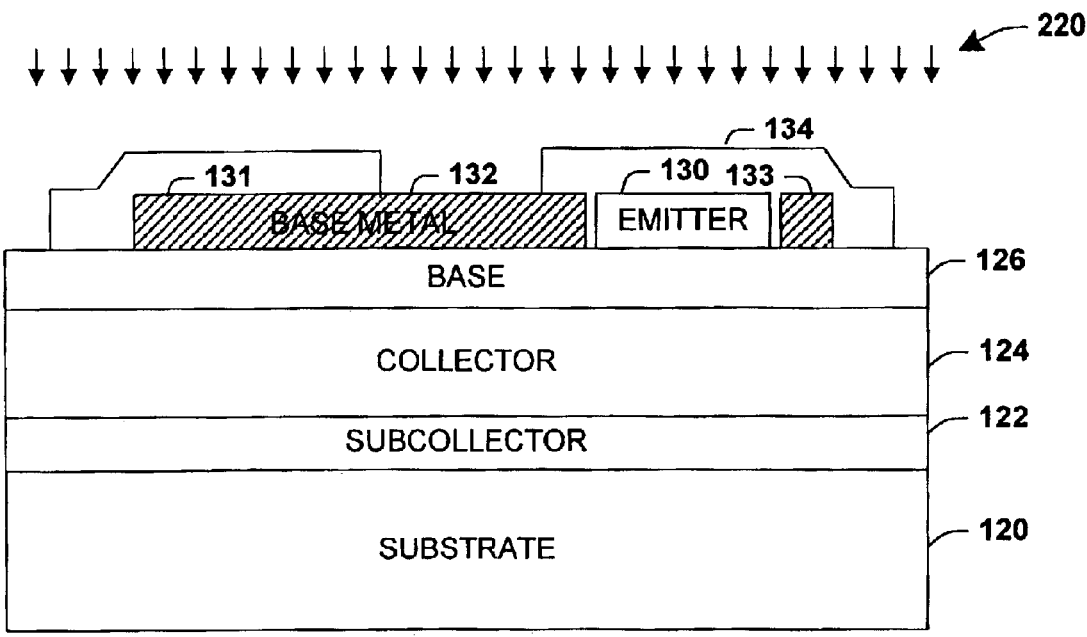
FIG. 11 is a schematic cross-sectional illustration of the structure of FIG. 10 undergoing an etch to form base mesas in accordance with an aspect of the present invention.
Figure 12:
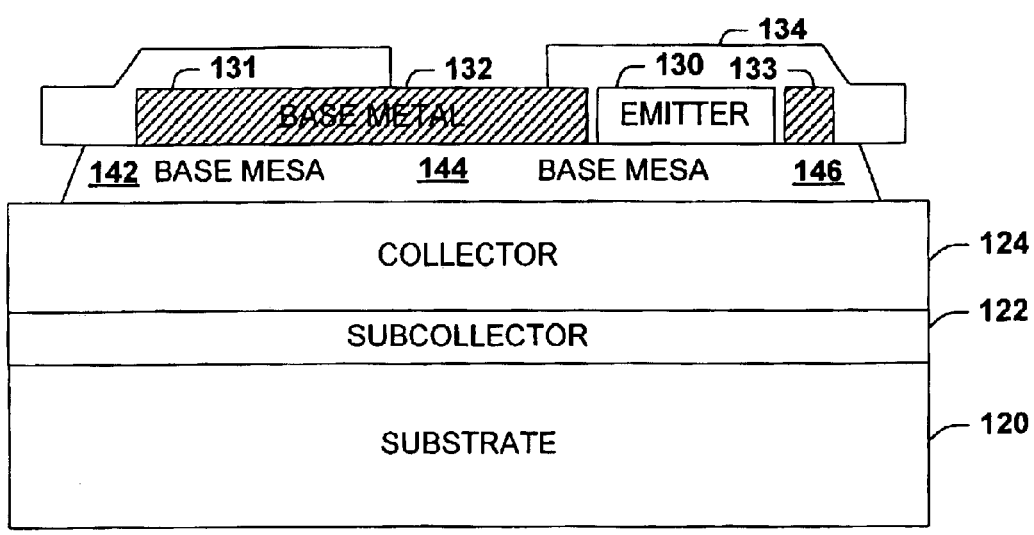
FIG. 12 is a schematic cross-sectional illustration of the structure of FIG. 11 after the etch to form the base mesas is substantially complete in accordance with an aspect of the present invention.
Figure 13:
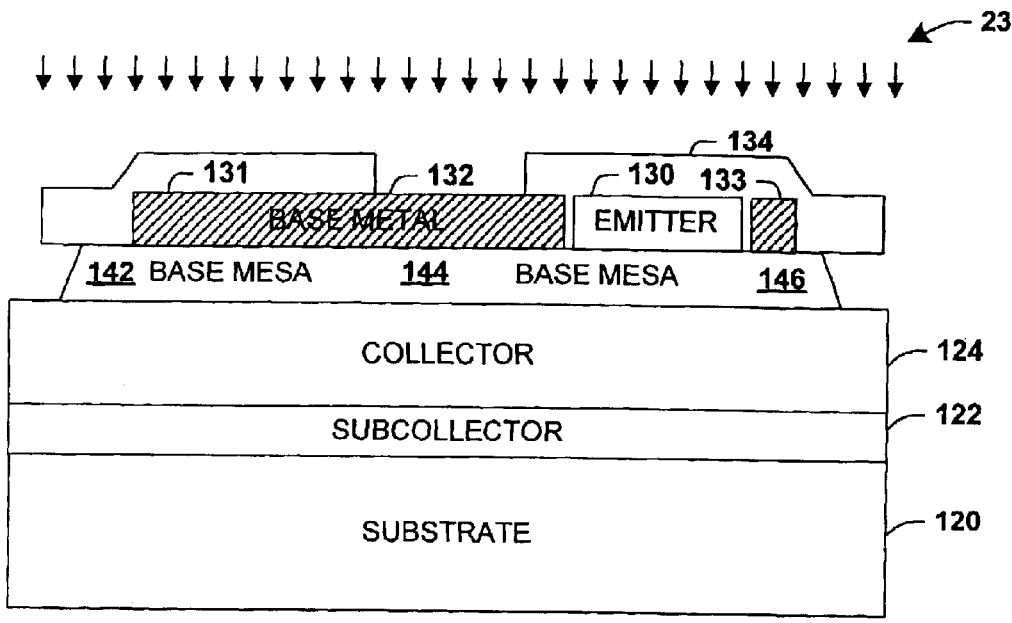
FIG. 13 is a schematic cross-sectional illustration of the structure of FIG. 12 undergoing an etch to form the collector regions and to remove collector material from underneath the connecting bridge in accordance with an aspect of the present invention.

A photoresist layer 134 is formed on the base layer 126 as illustrated in FIG. 8. The photoresist layer 134 has a thickness suitable for functioning as a mask for etching the underlying base layer 126. The photoresist layer 134 is then patterned by a performing selective irradiation 210 (FIG. 9) to define a base mesa etch mask. The irradiated or nonirradiated portions are removed by applying a developer material. Any suitable photolithographic techniques can be performed to form a patterned photoresist material layer. Alternatively, the base mesa etch mask can be formed employing a dielectric hard mask. FIG. 10 illustrates a top view of a portion of the resultant structure including the base contact 131, the connecting bridge 132, the contact 133, the emitter 130, and the base mesa etch mask 134.

An etch 220 (FIG. 11) is performed to form base mesa regions 142, 144 and 146 (FIG. 12) from the arsenic based base layer 126. The etch 220 can be a wet etch using an acid base wet etchant, such as a mixture of Phosphoric Acid ($H_3PO_4$) and Hydrogen Peroxide ($H_2O_2$). Typically, the wet etch is an isotropic etch that undercuts the base mesa etch mask in all direction. However, by employing a short etch, the base mesa etch mask will not undercut substantially. A selective etch technique is used to etch the arsenic based base layer at a relatively greater rate as compared to patterned photoresist layer 134, the base metal layer 132 and the underlying phosphorous based collector layer 124. The collector layer 124 acts as a stop layer to the etch 220, so that the etching 220 does not gouge into the collector layer 124. The base mesas 142 and 146 are formed as a result of the etch 220. A remaining portion 144 of the base layer 126 remains underneath the bridge 140.

Figure 14:
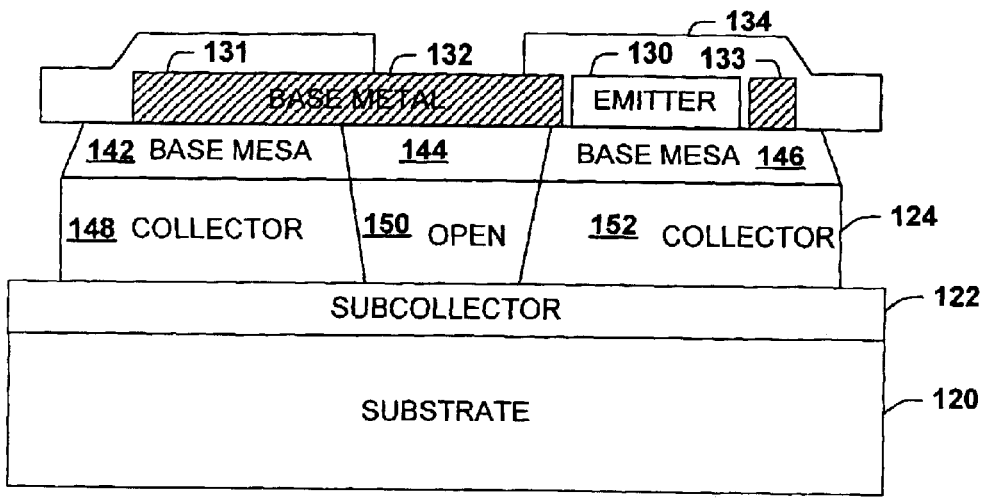
FIG. 14 is a schematic cross-sectional illustration of the structure of FIG. 13 after the etch to form the collector regions and to remove collector material from underneath the connecting bridge is substantially complete in accordance with an aspect of the present invention.

An etch 230 (FIG. 13) is performed to remove the phosphorous based collector material to form collector regions 148 and 152 (FIG. 14). The etch 230 employs the base mesa regions as a mask. The etch 230 is a wet etch using an acid base wet etchant, such as an HCl wet etch. As previously discussed, phosphorous based materials have unusual etching properties. The collector etch only undercuts facets that are both oriented at about a +/−45° or about a +/−135° to a major flat of the wafer and that have convex (i.e., greater or equal to 1800) geometric surfaces. Therefore, during the etch 230, the collector material is removed underneath the bridge, since the bridge is oriented at about a +/−45° or about a +/−135° to a major flat of the wafer, and has a side that is convex. The etch 230 forms both the collector regions 148 and 152 and an open region 150 (FIG. 14) under the remaining base material 144 and the connecting bridge 132.

Figure 15:
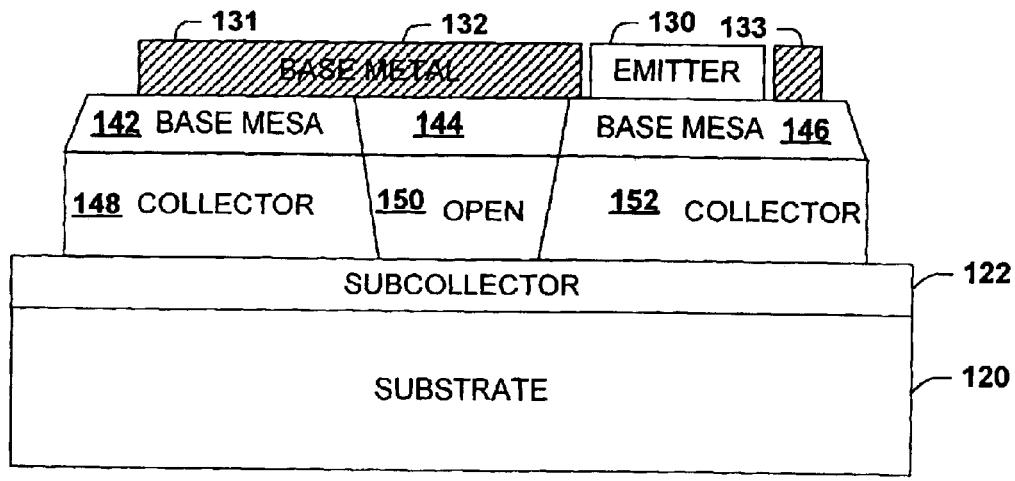
FIG. 15 is a schematic cross-sectional illustration of the structure of FIG. 14 after undergoing a strip of excess photoresist in accordance with an aspect of the present invention.
Figure 16:
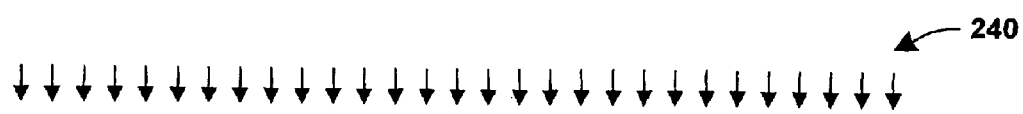
FIG. 16 is a schematic cross-sectional illustration of the structure of FIG. 15 after providing a second patterned photoresist layer and undergoing an etch to form the subcollector regions to remove subcollector material from under the connecting bridge in accordance with an aspect of the present invention.
Figure 16:
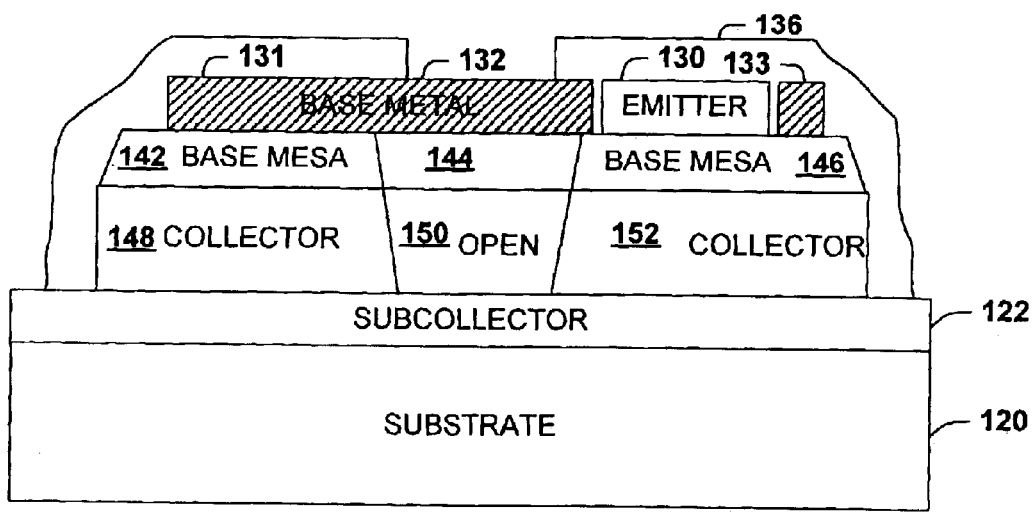
Figure 17:
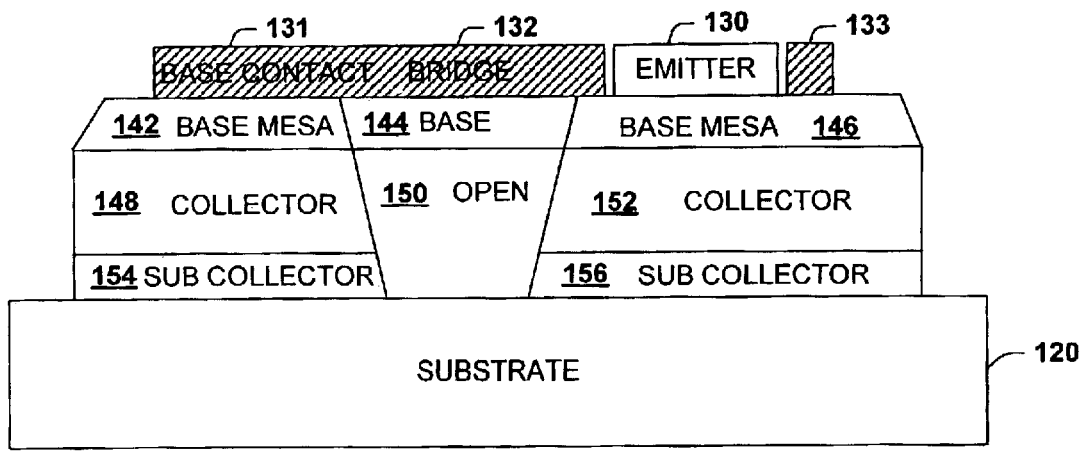
FIG. 17 is a schematic cross-sectional illustration of the structure of FIG. 16 after the etch to form the subcollector regions after undergoing a strip of excess photoresist and to remove subcollector material from underneath the connecting bridge and in accordance with an aspect of the present invention.

FIG. 15 illustrates a partially complete HBT device after a stripping step (e.g., ashing in an $O_2$ plasma) is substantially complete to remove remaining portions of the patterned photoresist layer 134. A second photoresist layer 136 is formed on the resultant structure and patterned to form a subcollector mask. Next, an etch 240 (FIG. 16) is performed to remove the phosphorous based subcollector material to form subcollector regions 154 and 156 (FIG. 17). The etch 240 is a wet etch using an acid base wet etchant, such as an HCl wet etch. As previously discussed, phosphorous based materials have unusual etching properties. If a phosphorous based subcollector is employed, the subcollector etch only undercuts facets that are both oriented at about a +/−45° or about a +/−135° to a major flat of the wafer and that are convex (i.e., greater or equal to 180°). Therefore, during the etch 240, the subcollector material is removed underneath the remaining base material 144 and the connecting bridge 132, since the connecting bridge 132 is oriented at about a +/−45° or about a +/−135° to a major flat of the wafer, and has a side that is convex. The etch 240 forms both the subcollector regions 154 and 156 and extends the open region 150 under the base material 144 and the bridge 132 to the InP substrate 120.

Figure 18:
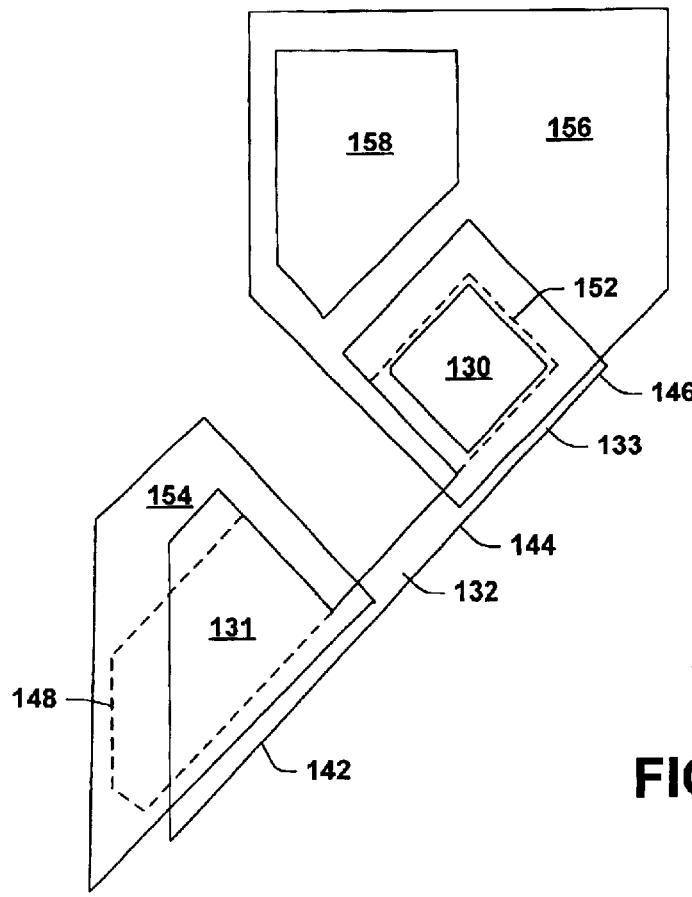
FIG. 18 illustrates a top representative view of the structure of FIG. 17 in accordance with an aspect of the present invention.

FIG. 18 illustrates a top view of the resultant HBT structure. An additional process is performed to provide a collector contact 158, which is coupled to the subcollector region 156 completing the formation of the HBT structure. The HBT structure includes the base contact 131, the connecting bridge 132, the base 133, the emitter 130, and the subcollector region 156. The first collector mesa 148 and the second collector mesa 152 are illustrated with dashed lines. The first base mesa 142 resides under the base contact 131, the second base mesa 146 resides under the base 133, and the remaining base material 144 resides under the conducting bridge 132. As illustrated in FIG. 18, the HBT device has a base undercut cantilever base contact structure that further reduces the base-collector capacitance. The result is provided due alignment of the orientation of the intrinsic HBT base contact along about a +/−45° or about a +/−135° angle to the major flat. Therefore, undercutting portions of the collector and subcollector that have a convex geometric surface during the etching process.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabricating a heterojunction bipolar transistor (HBT) device on a wafer substrate having a major flat, the method comprising:

providing a subcollector layer over the wafer substrate, a phosphorous based collector layer over the subcollector layer, a base layer over the phosphorous based collector layer, and an emitter layer over the base layer;

removing portions of the emitter layer to form an emitter;

depositing a base metal to form a base contact and a connecting bridge, the connecting bridge being oriented at about one of a 001, 010, 00$\bar{1}$, and 0$\bar{1}$0 direction with respect to the major flat of the wafer;

etching portions of the base layer to form a first base mesa below the base contacts, a second base mesa below the emitter, and a remaining portion of the base material between the first base mesa and the second base mesa, the connecting bridge overlying the remaining portion of base material and connecting the second base mesa to the base contact; and performing a collector etch to form at least one collector region, the collector etch undercutting the conductive bridge and the remaining portion of the base material to remove collector material from underneath the bridge and the remaining portion of the base material and to form an opening underneath the bridge and the remaining portion of the base material.

2. The method of claim 1, further comprising performing a subcollector etch to form at least one subcollector region, the subcollector etch removes subcollector material from underneath the connecting bridge and the remaining portion of the base material and extends the opening to the wafer substrate.

3. The method of claim 1, the first base mesa and the base contact form a base contact portion and the second base mesa and the emitter form an intrinsic HBT portion.

4. The method of claim 3, the intrinsic HBT portion, the base contact portion and the connecting bridge being aligned at one of about a 001, 010, 00$\bar{1}$, and 0$\bar{1}$0 direction with respect to the major flat of the wafer.

5. The method of claim 1, the collector etch being a wet etch.

6. The method of claim 1, the connecting bridge having at least one convex geometric surface.

7. The method of claim 1, the collector phosphorous based material being one of Indium Phosphide (InP) and Indium Gallium Phosphide (InGaP).

8. The method of claim 1, the base layer being formed from one of Indium Gallium Arsenide (InGaAs), Indium Aluminum Arsenide (InAlAs), Indium Gallium Aluminum Arsenide (InAlGaAs), Gallium Arsenide Antimonide (GaAsSb) and Gallium Arsenide (GaAs).

9. The method of claim 1, the subcollector layer being formed from one of a phosphorous based material and an arsenic based material.

* * * * *